(12) United States Patent
Luo et al.

(10) Patent No.: US 10,910,286 B2
(45) Date of Patent: Feb. 2, 2021

(54) WAFER-LEVEL SYSTEM-IN-PACKAGE PACKAGING METHOD AND PACKAGE STRUCTURE THEREOF

(71) Applicant: Ningbo Semiconductor International Corporation, Ningbo (CN)

(72) Inventors: Hailong Luo, Ningbo (CN); Clifford Ian Drowley, Ningbo (CN)

(73) Assignee: Ningbo Semiconductor International Corporation, Ningbo (CN)

( * ) Notice: Subject to any disclaimer, the term of this patent is extended or adjusted under 35 U.S.C. 154(b) by 15 days.

(21) Appl. No.: 16/227,978

(22) Filed: Dec. 20, 2018

(65) Prior Publication Data

US 2020/0075442 A1  Mar. 5, 2020

Related U.S. Application Data

(63) Continuation of application No. PCT/CN2018/113108, filed on Oct. 31, 2018.

(30) Foreign Application Priority Data

Sep. 4, 2018  (CN) .......................... 2018 1 1028265

(51) Int. Cl.
*H01L 23/31* (2006.01)
*H01L 21/56* (2006.01)
(Continued)

(52) U.S. Cl.
CPC .......... *H01L 23/3114* (2013.01); *H01L 21/56* (2013.01); *H01L 23/3121* (2013.01); *H01L 24/09* (2013.01); *H01L 25/0655* (2013.01)

(58) Field of Classification Search
CPC ............. H01L 23/3114; H01L 25/0655; H01L 23/3121; H01L 24/09; H01L 21/56
(Continued)

(56) References Cited

U.S. PATENT DOCUMENTS 7,989,928 B2 * 8/2011 Liao ...................... H01L 21/568
257/659
9,820,373 B2 * 11/2017 Pennathur .............. H05K 1/023
(Continued)

FOREIGN PATENT DOCUMENTS

CN        103035591 A     4/2013
CN        106898580 A     6/2017
(Continued)

*Primary Examiner* — Vu A Vu
(74) *Attorney, Agent, or Firm* — Anova Law Group, PLLC

(57) ABSTRACT

Wafer-level system-in-package packaging method and package structure are provided. The method includes: forming a bonding structure, where the bonding structure includes a device wafer and a plurality of chips bonded to the device wafer, where the plurality of chips contains one or more first chips to-be-shielded; forming an encapsulation layer covering the plurality of chips; forming a trench in the encapsulation layer to surround each first chip of the one or more first chips; and forming a conductive material in the trench and on the encapsulation layer, where the conductive material includes a shielding housing, the shielding housing including a conductive sidewall formed in the trench and a conductive layer formed on a portion of the encapsulation layer above the each first chip and connected with the conductive sidewall.

20 Claims, 4 Drawing Sheets

(51) Int. Cl.
*H01L 25/065* (2006.01)
*H01L 23/00* (2006.01)

(58) Field of Classification Search
USPC .......................................................... 257/678
See application file for complete search history.

(56) References Cited

U.S. PATENT DOCUMENTS

2010/0207257 A1* 8/2010 Lee ..................... B81B 7/0061
257/660
2017/0330839 A1 11/2017 Kim et al.
2019/0103365 A1* 4/2019 Singh .................... H01L 23/552

FOREIGN PATENT DOCUMENTS

| CN | 107104094 A | 8/2017 |
| CN | 107248509 A | 10/2017 |
| CN | 107481977 A | 12/2017 |

* cited by examiner

WAFER-LEVEL SYSTEM-IN-PACKAGE PACKAGING METHOD AND PACKAGE STRUCTURE THEREOF

CROSS-REFERENCES TO RELATED APPLICATION

This application is a continuation application of PCT Patent Application No. PCT/CN2018/113108, filed on Oct. 31, 2018, which claims priority to Chinese patent application No. 201811028265.7, filed on Sep. 4, 2018, the entirety of all of which is incorporated herein by reference.

TECHNICAL FIELD

The present disclosure generally relates to the field of semiconductor technologies and more particularly, relates to a wafer-level system-in-package (WLSiP) packaging method and a WLSiP package structure.

BACKGROUND

With the development of ultra-large-scale integrated circuits, the feature size of integrated circuits continues to decrease and requirements for packaging technologies of integrated circuits are increasing correspondingly. Conventional packaging technologies include ball grid array package (BGA), chip scale package (CSP), wafer level package (WLP), 3D package and system-in-package (SiP) etc.

At present, in order to meet the goal of low cost, high reliability, fast packaging and high density of integrated circuit packaging, advanced packaging methods mainly use wafer-level system-in-package (WLSiP). Comparing with conventional system-in-package, wafer-level system-in-package, a package-integrated process completed on wafers, has advantages including greatly reducing the area of package structures, reducing manufacturing costs, optimizing electrical performance and performing batch manufacturing etc., which may significantly reduce workload and equipment requirements.

The integrated circuits are susceptible to external magnetic fields in operations, resulting in insufficient stability. Conventional technologies reduce the interference of the external magnetic fields by providing shielding structures in the integrated circuits, but the integrated circuits having the shielding function have problems of large volumes and thicknesses.

SUMMARY

One aspect of the present disclosure provides a WLSiP packaging method. The method includes: forming a bonding structure, where the bonding structure includes forming a bonding structure, where the bonding structure includes a device wafer and a plurality of chips bonded to the device wafer, where the plurality of chips contains one or more first chips to-be-shielded; forming an encapsulation layer covering the plurality of chips; forming a trench in the encapsulation layer to surround each first chip of the one or more first chips; and forming a conductive material in the trench and on the encapsulation layer, where the conductive material includes a shielding housing, and the shielding housing including a conductive sidewall formed in the trench and a conductive layer formed on a portion of the encapsulation layer above the each first chip and connected with the conductive sidewall.

Another aspect of the present disclosure provides a WLSiP package structure. The structure includes: a device wafer; a plurality of chips bonded to the device wafer, wherein the plurality of chips contains one or more first chips to-be-shielded; an encapsulation layer covering the plurality of chips; a conductive sidewall in the encapsulation layer to surround the each first chip of the one or more first chips; and a shielding housing including the conductive sidewall and a conductive layer formed on the encapsulation layer above the each first chip and connected with the conductive sidewall.

Other aspects or embodiments of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Figure 1:
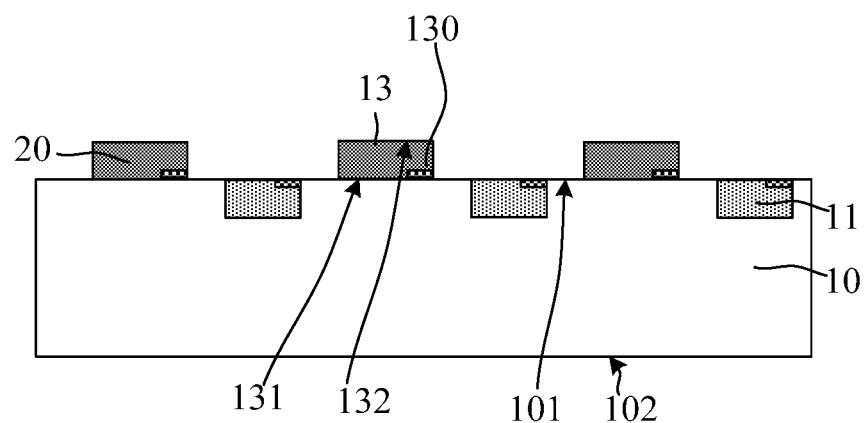
FIGS. 1-6 illustrate structural schematics corresponding to certain stages of an exemplary wafer-level system-in-package (WLSiP) packaging method according to various disclosed embodiments of the present disclosure.

Reference will now be made in detail to exemplary embodiments of the disclosure, which are illustrated in the accompanying drawings. Wherever possible, the same reference numbers will be used throughout the drawings to refer to the same or like parts.

It can be known from the background that integrated circuits have problems of large volumes and thicknesses. In order to reduce the external magnetic field interference, the conventional technologies install a metal housing on each of the integrated circuits to shield the magnetic fields. Usually only a portion of chips in an integrated circuit are easily interfered by external magnetic fields, but the metal housing is used to shield the magnetic fields for all chips, where the chips which are easily interfered are not protected for example. Therefore, a size of the metal housing is usually large, which may increase the volume and thickness of the integrated circuit.

The present disclosure provides a wafer-level system-in-package (WLSiP) packaging method and a WLSiP package structure, with reduced volume and reduced thickness.

An exemplary wafer-level system-in-package (WLSiP) packaging method may include: forming a bonding structure, where the bonding structure includes forming a bonding structure, where the bonding structure includes a device wafer and a plurality of chips bonded to the device wafer, where the plurality of chips contains one or more first chips to-be-shielded; forming an encapsulation layer covering the plurality of chips; forming a trench in the encapsulation layer to surround each first chip of the one or more first chips; and forming a conductive material in the trench and on the encapsulation layer, where the conductive material includes a shielding housing, and the shielding housing including a conductive sidewall formed in the trench and a conductive layer formed on a portion of the encapsulation layer above the each first chip and connected with the conductive sidewall.

In the present disclosure, the trench surrounding the each first chip is formed in the encapsulation layer. The conductive sidewall is formed by filling the conductive material in the trench and is surrounding the sides of the first chip. The conductive layer connected with the conductive sidewall is formed above the first chip. The conductive layer and the conductive sidewall form the shielding housing, which may protect the first chip in the shielding housing and reduce the interference of external magnetic fields on the first chip. Since the shielding housing is formed above a portion of the first chip, it may not increase the thickness and volume of entire packaging structure, which may make the packaging structure lighter.

To more clearly describe the objectives, features and advantages of the present disclosure, the present disclosure is further illustrated in detail with reference to the accompanying drawings in conjunction with embodiments.

FIGS. 1-6 illustrate structural schematics corresponding to certain stages of an exemplary WLSiP packaging method according to various disclosed embodiments of the present disclosure.

Referring to FIG. 1, a bonding structure may be formed. The bonding structure may include: a device wafer 10; a plurality of chips 20 bonded to the device wafer 10; and a first chip 13 to-be-shielded in the plurality of chips 20, where the number of the first chip 13 may be one or more. It should be noted that, one first chip 13 is used as an example for description in FIG. 1.

The device wafer 10 may be a wafer to-be-packaged for a device completion. In one embodiment, a semiconductor substrate of the device wafer 10 may be made of silicon. In other embodiments, the semiconductor substrate may be made of a material including germanium, silicon germanium, silicon carbide, gallium arsenide, indium gallium and/or any other suitable material(s). The semiconductor substrate may also be made of a material including a silicon substrate on an insulator, a germanium substrate on an insulator, and/or any other suitable material(s). The material of the semiconductor substrate may be a material suitable for process requirements or easy to integrate. The device wafer 10 has a thickness of about 10 micrometers to about 100 micrometers according to actual process requirements.

A plurality of second chips 11 may be formed in the device wafer 10. For example, a surface of the device wafer 10 forming the second chips 11 is a wafer front surface 101. A surface opposite to the wafer front surface 101 is a wafer back surface 102. The plurality of chips 20 may be bonded to the wafer front surface 101 of the device wafer 10.

The plurality of chips 20 bonded to the device wafer 10 may be used as chips to-be-integrated in the WLSiP. In one embodiment, the WLSiP packaging method may be used to implement heterogeneous integration. Correspondingly, the plurality of chips 20 may be made of silicon wafers or other suitable materials.

The number of the chips 20 may be at least one, and functions of the plurality of chips may be different when the number of the chips 20 is plural. The chips 20 may be fabricated using an integrated circuit fabrication technology and may be used as memory chips, communication chips, processing chips and logic chips. The chip 20 may include a device such as an n-channel metal-oxide-semiconductor (NMOS) device or a p-channel metal-oxide-semiconductor (PMOS) device, which may be formed on the semiconductor substrate.

For example, the bonding of the chips 20 to the device wafer 10 may be achieved using a method including fusion bonding, adhesive bonding and glass dielectric bonding.

In the plurality of chips 20, the first chip 13 may be susceptible to an external magnetic field and is the chip to-be-shielded. A bond pad 130 may be formed in the first chip 13, which may be used for an electrical connection of the first chip 13. A surface of the first chip 13 adjacent to the bond pad 130 is a chip front surface 131. A surface opposite to the chip front surface 131 is a chip back surface 132. In one embodiment, the chip front surface 131 of the first chip 13 may be bonded to the wafer front surface 101 of the device wafer 10.

Figure 2:
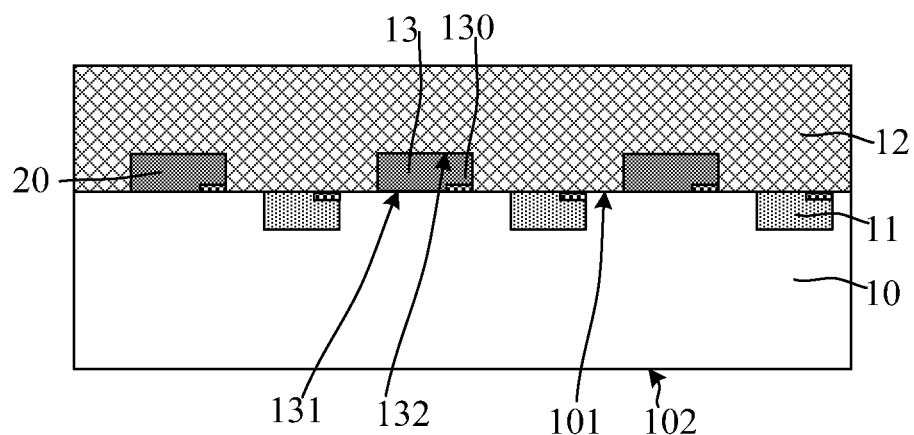

Referring to FIG. 2, an encapsulation layer 12 may be formed to cover the plurality of chips 20. The encapsulation layer 12 may completely cover the plurality of chips 20 (including the first chip 13).

The encapsulation layer 12 may be used for insulation, sealing and moisture proof, and may reduce a probability of chips 20 being damaged, contaminated or oxidized, which may facilitate optimizing of the performance of the obtained WLSiP package structure.

In one embodiment, the encapsulation layer 12 may also insulate a subsequently formed shielding housing from the first chip 13.

For example, the encapsulation layer 12 may be made of a material including a polymer or a dielectric.

In one embodiment, forming the encapsulation layer 12 may include: an injection molding process which may be used to form the encapsulation layer 12. The injection molding process may have good filling performance and the encapsulation layer 12 formed by the injection molding process may have a good insulation and sealing on the chips 20.

For example, the encapsulation layer 12 may be made of epoxy resin (Epoxy). Epoxy resin has advantages of low shrinkage, good adhesion, good corrosion resistance, excellent electrical properties and low cost, and is widely used a packaging material for electronic devices and integrated circuits. In other embodiments, the encapsulation layer 12 may be made of a thermosetting material including polyimide or silica gel, or also be made of a dielectric material including aluminum oxide or aluminum nitride.

The encapsulation layer 12 may cover the chip back surface 132 of the first chip 13 and the wafer front surface 101 of the device wafer 10, and may be in contact with the chip back surface 132 and the wafer front surface 101.

Figure 3:
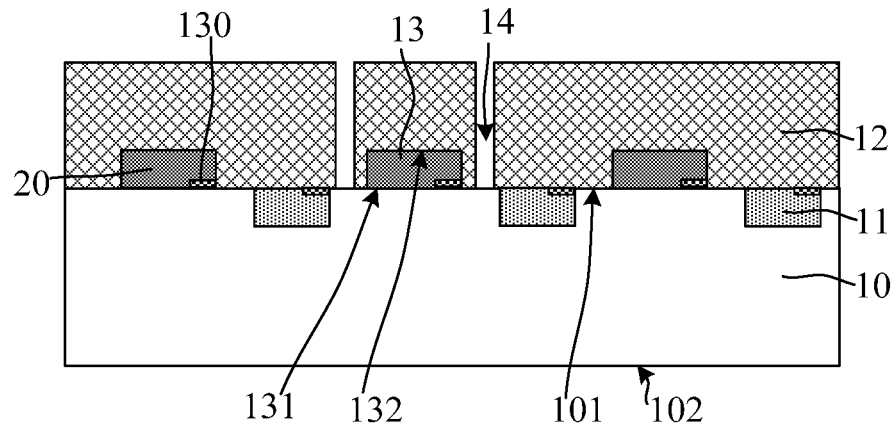
Figure 4:
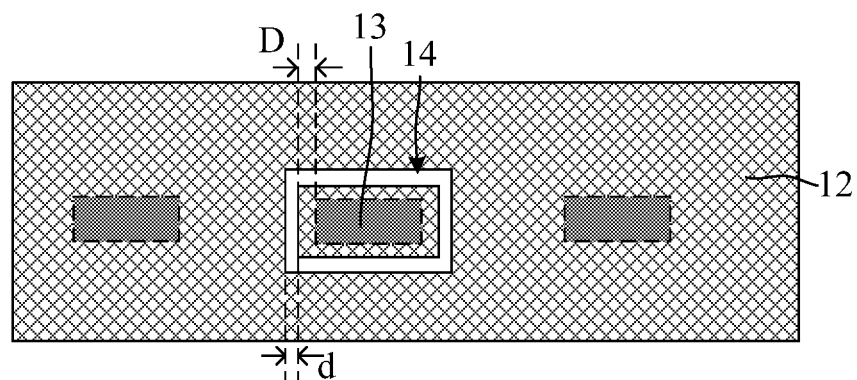

As shown in FIG. 3 and FIG. 4, a trench 14 surrounding the each first chip 13 may be formed in the encapsulation layer 12.

The trench 14 may be used to fill a conductive material in a subsequent step to form a conductive sidewall, which may be used to protect the first chip 13 and reduce the interference of external magnetic fields on the first chip 13.

For example, the trench 14 surrounding the each first chip 13 may be formed and may be filled with a shielding material to form a shielding layer surrounding the each first chip 13.

A width d of the trench 14 may be used to define a thickness of the conductive sidewall. If the width d of the trench 14 is too large, the width of the conductive sidewall may be too large, which may increase the thickness and volume of entire packaging structure. If the width d of the trench 14 is too small, the width of the conductive sidewall may be too small, which may affect the shielding effect of the conductive sidewall. Correspondingly, the width d of the trench 14 may be in a range of about 10 micrometers to about 50 micrometers.

As shown in FIG. 4, a projection of the first chip 13 on the device wafer 10 is rectangular. In one embodiment, a projection of the trench 14 in the encapsulation layer 12 on the device wafer 10 is rectangular. That is, a shape of the trench 14 is compatible to a shape of the first chip 13. Therefore, the formed shielding structure may have a small volume and have a good shielding effect on the first chip 13.

The sidewall of the trench 14 adjacent to the first chip 13 is an inner sidewall. A distance between the inner sidewall and the first chip 13 is D (a distance between the inner sidewall and an opposite side of the first chip 13 corresponding to the inner sidewall). The distance D may be used to define the distance between the first chip 13 and the subsequently formed conductive sidewall. The distance D may be also used to define the thickness of the encapsulation layer between the first chip 13 and the conductive sidewall.

If the distance D is too large, a distance between the trench 14 and other chips 20 adjacent to the first chip 13 may be relatively small, which may affect the performance of other chips, and the distance between the conductive sidewall and the first chip 13 may be relatively large, which may reduce the shielding effect on the first chip 13. If the distance D is too small, the thickness of the encapsulation layer between the conductive sidewall and the first chip 13 may be relatively small, which may affect insulation between the conductive sidewall and the first chip 13. Correspondingly, the distance D between the inner sidewall and the opposite side of the first chip 13 corresponding to the inner sidewall may be in a range of 5 micrometers to 100 micrometers.

As shown in FIG. 3, in one embodiment, the WLSiP packaging method may include: forming the trench 14 exposing the device wafer 10 in the encapsulation layer 12. In such way, the conductive sidewall formed in the trench 14 may be in contact with the device wafer 10, which may make the formed conductive sidewall to shield the first chip 13 from a wide range.

In one embodiment, a mask pattern exposing the region of the trench 14 may be formed on the encapsulation layer 12. Using the mask pattern, the encapsulation layer 12 may be etched to form the trench 14.

For example, the encapsulation layer 12 may be etched to form the trench 14 by a laser etching process. The laser etching process has high precision, so the formation position of the trench 14 and the size of the trench 14 may be determined precisely.

For the etching of the encapsulation layer 12, the device wafer 10 may be used as an etching stop layer; and the etching process may be stopped when the trench 14 exposes the device wafer 10.

It should be noted that, in other embodiments, the encapsulation layer 12 may be etched, which may make the bottom of the formed trench 14 in the encapsulation layer 12. That is, the trench 14 may not pass through the encapsulation layer 12 and may not expose the device wafer 10, but a certain thickness of the encapsulation material may be between the device wafer 10 and the trench 14. In such way, when filling the conductive material in the trench 14, the formed conductive sidewall may be not in contact with the device wafer 10, but still may have certain thickness extension in a direction perpendicular to the device wafer 10, so the conductive sidewall may still shield the first chip 13.

Figure 5:
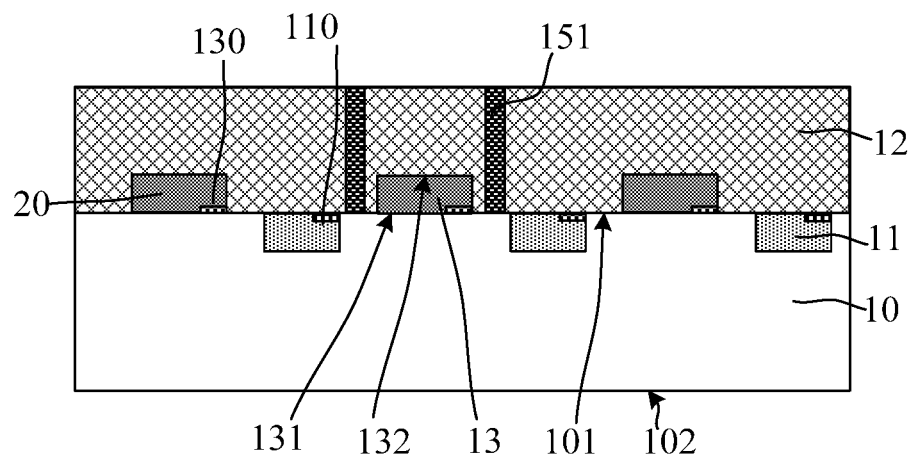
Figure 6:
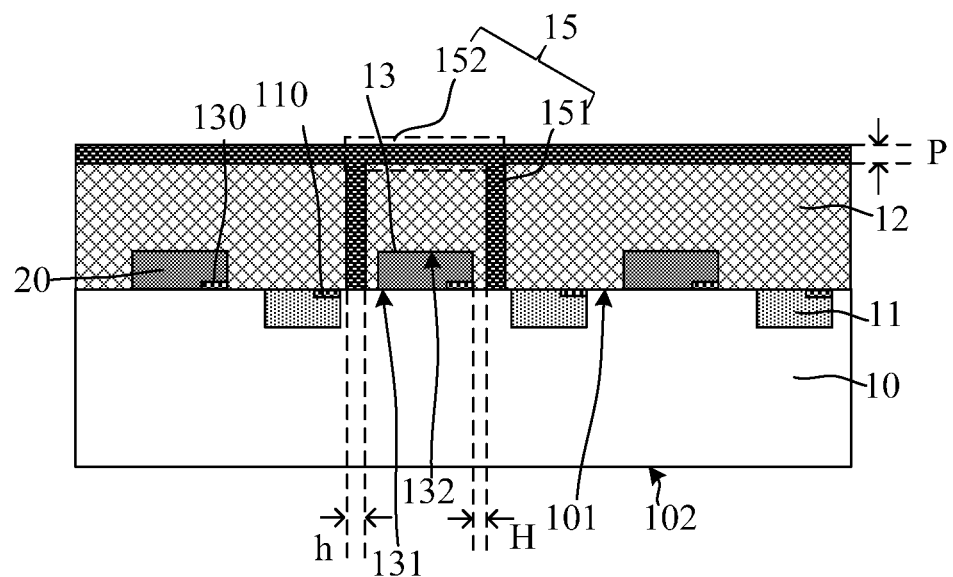

Referring to FIG. 5 and FIG. 6, the conductive material may be formed in the trench 14 (shown in FIG. 3 and FIG. 4) and on the encapsulation layer 12; the conductive material in the trench 14 is a conductive sidewall 151; and the conductive material on the encapsulation layer 12 above the first chip 13 is a conductive layer 152, which may be connected with the conductive sidewall 151 to form a shielding housing.

Referring to FIG. 5, the trench 14 may be filled with the conductive material to form the conductive sidewall 151. The conductive sidewall 151 may be used to reduce the interference of the external magnetic field on the first chip 13, which may improve stability and reliability of the performance of integrated circuits.

The conductive sidewall 151 may be used for shielding from sides of the first chip 13 and may form the shielding housing with a subsequently formed conductive layer. In one embodiment, the shielding housing is an electrostatic shielding structure which may terminate an external electric field on a surface of the shielding housing and transport charges to a ground end. Correspondingly, in one embodiment, the formed package structure may connect the shielding housing with the ground end during operations.

It should be noted that, in other embodiments, the shielding housing may be an electromagnetic shielding structure for reducing an influence of a high-frequency electromagnetic field, and an interference field may form an eddy current in the shielding housing, which may weaken a magnitude of the interference field in the integrated circuit and may achieve the shielding effect.

In one embodiment, in order to achieve the shielding effect, the conductive material may be a metal. For example, the conductive sidewall 151 may be made of one or more materials including silver, copper, tin, aluminum, zinc, tungsten, or a combination thereof. In other embodiments, the conductive material may be an alloy. For example, the conductive material may be made of an alloy including stainless steel.

In some embodiments, the conductive sidewall 151 may be formed by an electroplating process. In other embodiments, the conductive sidewall 151 may be formed by a physical vapor deposition or a sputtering deposition.

In one embodiment, the conductive sidewall 151 may be formed by filling the conductive material in the trench 14, so the thickness of the conductive sidewall 151 may be same as the width of the trench 14 (shown in FIG. 4). A distance between the conductive sidewall 151 and the first chip 13 may be same as a distance between the trench 14 (shown in FIG. 4) and the first chip 13. Correspondingly, the thickness h of the conductive sidewall 151 may be about 10 micrometers to about 50 micrometers and the distance H between the inner sidewall of the conductive sidewall 151 and the first chip 13 may be about 5 micrometers to about 100 micrometers.

As shown in FIG. 6, a conductive material may be continuously formed. The conductive material may be formed on the encapsulation layer, where the conductive layer 152 may be on the encapsulation layer 12 above the each first chip 13 and may form the shielding housing 15 with the conductive sidewall 151.

The conductive layer 152 may be connected to the conductive sidewall 151 to form the closed shielding housing above the first chip 13. The encapsulation layer 12 between the first chip 13 and the conductive layer 152 may function as an insulation to prevent the shielding housing 15 from affecting normal operations of the first chip 13.

It should be noted that, if the thickness P of the conductive material on the encapsulation layer 12 is too large, the volume and thickness of the shielding housing may be easily increased; if the thickness P of the conductive material on the encapsulation layer 12 is too small, the shielding effect of the shielding housing 15 may be affected. Optionally, the thickness P of the conductive material on the encapsulation layer 12 may be in a range of about 5 micrometers to about 50 micrometers.

It should be noted that, in one embodiment, the shielding housing may be an electrostatic shielding structure. The conductive layer 152 on the encapsulation layer 12 may be used as a ground end and the shielding housing may be connected to the ground end during operations of the subsequent package structure.

In one embodiment, the WLSiP packaging method may further include: after forming the conductive layer 152, performing a wafer thinning treatment through the wafer back surface 102 of the device wafer 10; and after the thinning treatment, forming a silicon through hole interconnect structure in the device wafer 10, which will not be described in detail herein.

In one embodiment, the WLSiP packaging method may reduce the influence of an external magnetic field on the first chip 13 by partially shielding the first chip 13 and may selectively shield the first chip 13 to reduce the thickness and volume of the shielding housing.

Figure 7:
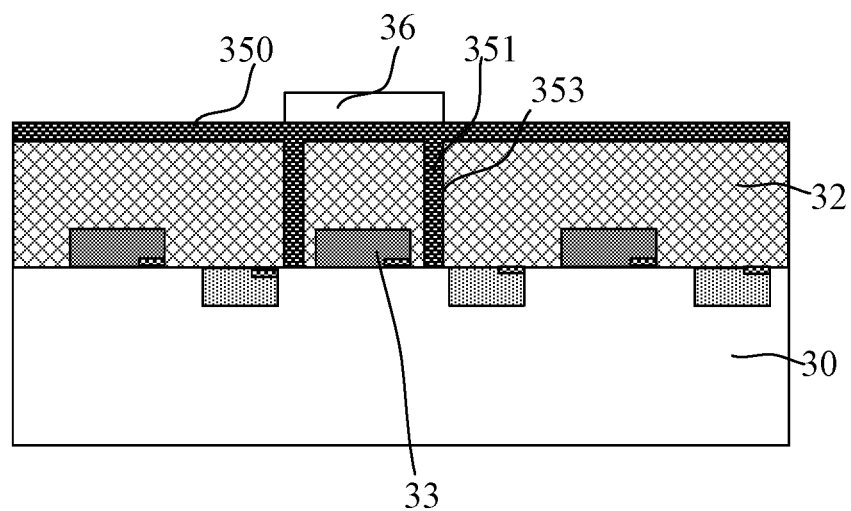
FIGS. 7-8 illustrate structural schematics corresponding to certain stages of another exemplary WLSiP packaging method according to various disclosed embodiments of the present disclosure.
Figure 8:
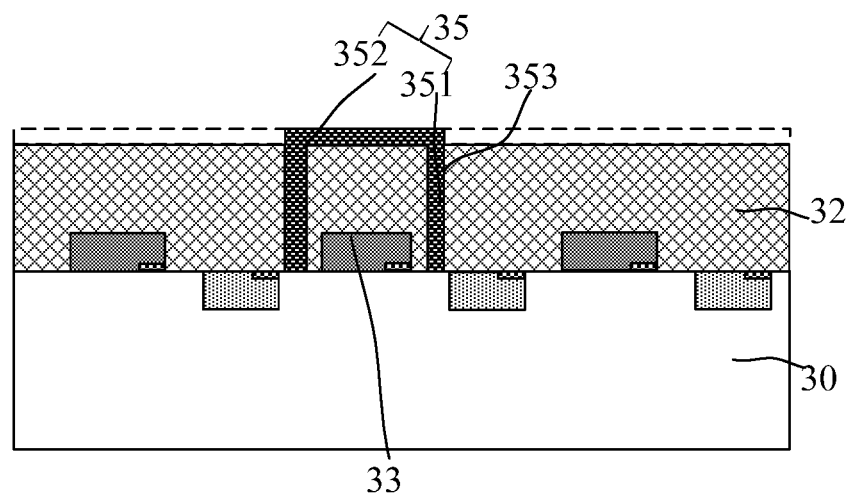

FIG. 7 and FIG. 8 illustrate structural schematics corresponding to another exemplary WLSiP packaging method according to various disclosed embodiments of the present disclosure. The exemplary WLSiP packaging method may be different from the previous exemplary embodiment in that this exemplary packaging method may further include:

after covering an encapsulation layer 32 with a conductive material 350, forming a conductive layer 352 by removing a first portion of the conductive material 350 to leave a second portion of the conductive material 350 remain on the portion of the encapsulation layer 32 above each first chip 33, where the remaining conductive material 350 may be the conductive layer 352.

In one embodiment, the conductive material which is not used for forming the shielding housing on the encapsulation layer 32 may be removed, which may reduce capacitive coupling caused by the excess conductive material and may optimize the performance of the package structure.

As shown in FIG. 7, a side of a conductive sidewall 351 opposite to the first chip 33 may be an outer side surface 353. Removing the first portion of the conductive material 350 to leave the second portion of the conductive material 350 remain on the portion of the encapsulation layer 32 above the each first chip 33 may include:

forming a mask layer 36 on the conductive material 350 above the first chip 33, where the mask layer 36 may cover the second portion of the conductive layer above the first chip 33 and a sidewall of the mask layer 36 may align with the outer side surface 353.

It should be noted that, the sidewall of the mask layer 36 may be aligned with the outer side surface 353. In such way, during removing the first portion of the conductive material, the excess conductive material 350 may be removed while remaining more conductive material 350 above the first chip 31 and in contact with the conductive sidewall 351, which may improve the shielding effect of the shielding housing.

For example, the mask layer 36 may be a photoresist.

As shown in FIG. 8, using the mask layer 36 (shown in FIG. 7) as a mask, the first portion of the conductive material 350 may be removed and the second portion of the conductive material 350 on the encapsulation layer 32 above the first chip may be remained. The remaining conductive material may be the conductive layer 352, which may be connected with the conductive sidewall 351 to form a shielding housing 35.

For example, the conductive material 350 may be a metal and the excess conductive material may be removed by a dry etching process. For example, the conductive material 350 may be aluminum and the first portion of the conductive material 350 may be removed by the dry etching process using a chorine etching gas.

In one embodiment, by removing the excess conductive material 350, the problem of capacitive coupling may be reduced while ensuring partial shielding for the first chip.

The present disclosure may also provide a WLSiP package structure. FIG. 6 illustrates a structural schematic corresponding to an exemplary WLSiP package structure of the present disclosure. The WLSiP package structure may include:

the device wafer 10 and the plurality of chips 20 bonded to the device wafer 10, where the plurality of chips 20 contains one or more first chips 13 to-be-shielded.

The device wafer 10 may be a wafer to-be-packaged for a device completion. In one embodiment, the semiconductor substrate of the device wafer 10 may be a silicon substrate. In other embodiments, the semiconductor substrate may be made of a material including germanium, silicon germanium, silicon carbide, gallium arsenide, indium gallium and/or any other suitable material(s). The semiconductor substrate may also be made of a material including a silicon substrate on an insulator, a germanium substrate on an insulator, and/or any other suitable material(s). The material of the semiconductor substrate may be a material suitable for process requirements or easy to integrate. The device wafer 10 has a thickness of about 10 micrometers to about 100 micrometers according to actual process requirements.

The plurality of second chips 11 may be formed in the device wafer 10. For example, a surface of the device wafer 10 forming the second chips 11 is a wafer front surface 101. A surface opposite to the wafer front surface 101 is a wafer back surface 102. The plurality of chips 20 may be bonded to the wafer front surface 101 of the device wafer 10.

The plurality of chips 20 bonded to the device wafer 10 may be used as chips to-be-integrated in the WLSiP package structure. In one embodiment, the package structure may be heterogeneously integrated. Correspondingly, the plurality of chips 20 may be made of silicon wafers or other suitable materials.

The number of the chips 20 may be at least one and functions of the plurality of chips may be different when the number of the chips 20 is plural. The chips 20 may be fabricated using an integrated circuit fabrication technology and may be used as memory chips, communication chips, processing chips and logic chips. Usually, the chip 20 may include a device such as an NMOS device or a PMOS device on the semiconductor substrate.

For example, the bonding of the chips 20 to the device wafer 10 may be achieved using a method including fusion bonding, adhesive bonding and glass dielectric bonding.

In the plurality of chips 20, the first chip 13, which is the chip to-be-shielded, may be susceptible to an external magnetic field. The number of the first chip 13 may be one or more. The bond pad 130 may be formed in the first chip 13, which may be used for an electrical connection of the first chip 13. A surface of the first chip 13 adjacent to the bond pad 130 is the chip front surface 131, and a surface opposite to the chip front surface 131 is the chip back surface 132. In one embodiment, the chip front surface 131 of the first chip 13 may be bonded to the wafer front surface 101 of the device wafer 10.

The encapsulation layer 12 may be formed to cover the plurality of chips 20. The encapsulation layer 12 may completely cover the plurality of chips 20 (including the first chip 13).

The encapsulation layer 12 may be used for insulation, sealing and moisture proof, and may reduce a probability of chips 20 being damaged, contaminated or oxidized, which may facilitate optimizing of the performance of the obtained wafer level package system in package structure.

In one embodiment, the encapsulation layer 12 may also insulate the shielding housing 15 from the first chip 13.

For example, the encapsulation layer 12 may be made of a material including a polymer or a dielectric.

In one embodiment, the encapsulation layer 12, which may be an injection layer, may be formed by the injection molding process. The injection molding process may have good filling performance and the encapsulation layer 12 may have a good insulation and sealing on the chips 20.

For example, the encapsulation layer 12 may be made of epoxy resin (Epoxy). Epoxy resin has advantages of low shrinkage, good adhesion, good corrosion resistance, excellent electrical properties and low cost, and is widely used a packaging material for electronic devices and integrated circuits.

In other embodiments, the encapsulation layer 12 may be made of a thermosetting material including polyimide or silica gel, or also be made of a dielectric material including aluminum oxide or aluminum nitride.

The encapsulation layer 12 may cover the chip back surface 132 of the first chip 13 and the wafer front surface 101 of the device wafer 10, and may be in contact with the chip back surface 132 and the wafer front surface 101.

The conductive sidewall 151 surrounding the each first chip 13 may be formed in the encapsulation layer 12. The conductive sidewall may be used to protect the first chip 13 and reduce the interference of external magnetic field on the first chip 13.

The conductive sidewall 151 may be used for shielding from sides of the first chip 13 and may form the shielding housing 15 with the conductive layer 152. In one embodiment, the shielding housing 152 is an electrostatic shielding structure which may terminate an external electric field on a surface of the shielding housing and transport charges to a ground end. Correspondingly, in one embodiment, the package structure formed may connect the shielding housing with the ground end during operations.

In order to achieve the shielding effect, the conductive material of the conductive sidewall 151 and the conductive layer 152 may be a metal. For example, the conductive sidewall 151 may be made of one or more materials including silver, copper, tin, aluminum, zinc, tungsten, or a combination thereof. In other embodiments, the conductive material may be an alloy. For example, the conductive material may be made of an alloy including stainless steel.

It should be noted that, if the thickness h of the conductive sidewall 151 is too large, it may increase the thickness and volume of entire packaging structure. If the thickness h of the conductive sidewall 151 is too small, it may affect the shielding effect of the conductive sidewall. Correspondingly, the thickness h of the conductive sidewall may be in a range of about 10 micrometers to about 50 micrometers.

Generally, a projection of the first chip 13 on the device wafer 10 is rectangular. Correspondingly, a projection of the conductive sidewall 151 of the first chip 13 on the device wafer 10 is rectangular. That is, a shape of the conductive sidewall 151 is compatible to a shape of the first chip 13. Therefore, the formed shielding structure may have a small volume, and have a good shielding effect on the first chip 13.

The sidewall of the conductive sidewall 151 adjacent to the first chip 13 is an inner sidewall. A distance between the inner sidewall and the opposite side of the first chip 13 corresponding to the inner sidewall is H. If the distance H is too large, a distance between the conductive sidewall 151 and other chips 20 adjacent to the first chip 13 may be relatively small, which may affect the performance of other chips, and may reduce the shielding effect on the first chip 13. If the distance H is small, it may affect insulation between the conductive sidewall 151 and the first chip 13. Correspondingly, the distance H between the inner sidewall and the opposite side of the first chip 13 corresponding to the inner sidewall may be in a range of about 5 micrometers to about 100 micrometers.

In one embodiment, in the WLSiP package structure, the conductive sidewall 151 in the encapsulation layer 12 may be in contact with the device wafer 10, which may make the formed conductive sidewall 151 to shield the first chip 13 from a wide range.

In other embodiments, the bottom of the conductive sidewall 151 may in the encapsulation layer 12, and a certain thickness of encapsulation material may be between the device wafer 10 and the conductive sidewall 151. In such way, the conductive sidewall 151 may be not in contact with the device wafer 10, but still may have certain thickness extension in a direction perpendicular to the device wafer 10, so the conductive sidewall 151 may still shield the first chip 13.

The package structure may further include: the conductive layer 152 on the encapsulation layer 12 above the each first chip 13, which may be used to connect with the conductive sidewall 151 to form the shielding housing 15.

In one embodiment, the entire surface of encapsulation layer 12 above the chip 13 may be covered with the conductive material. The conductive material on the encapsulation layer 12 and in contact with the conductive sidewall 151 may be the conductive layer 152, which may be used to connect with the conductive sidewall 151 to form the shielding housing 15.

The conductive layer 152 may be on the encapsulation layer 12 above the each first chip 13 and may be connected to conductive sidewall 151 on the side of the chip 13 to form the closed shielding housing above the first chip 13. The encapsulation layer 12 between the first chip 13 and the conductive layer 152 may function as an insulation to prevent the shielding housing 15 from affecting normal operations of the first chip 13.

It should be noted that, if the thickness P of the conductive material on the encapsulation layer 12 is too large, the volume and thickness of the shielding housing may be increased; and if the thickness P of the conductive material on the encapsulation layer 12 is too small, the shielding effect of the shielding housing 15 may be affected. Optionally, the thickness of the conductive material on the surface of the encapsulation layer 12 may be in a range of about 5 micrometers to about 50 micrometers.

It should be noted that, in one embodiment, the shielding housing 15 may be an electrostatic shielding structure. The conductive layer 152 on the encapsulation layer 12 may be used as a ground end and the shielding housing may be connected to the ground end during operations of the subsequent package structure.

In one embodiment, the device wafer 10 may be the wafer after the thinning treatment; and a silicon through hole interconnect structure may be formed in the device wafer 10, which will not be described in detail herein.

FIG. 8 illustrates a structural schematic corresponding to another exemplary WLSiP package structure according to various disclosed embodiments of the present disclosure. The exemplary WLSiP package structure may be different from the previous exemplary embodiment in that:

In one embodiment, in the WLSiP package structure, a conductive layer 352 may partially cover the encapsulation layer 32 above the each first chip 33. In one embodiment, the conductive layer 352 may only cover the encapsulation layer 32 above the first chip 33 and may not cover other surface regions of the encapsulation layer 32, which may reduce capacitive coupling and may optimize the performance of the WLSiP package structure.

A side of the conductive sidewall 351 opposite to the first chip 33 may be the outer side surface 353. The sidewall of the conductive layer 352 may be aligned with the outer side surface 353. In one embodiment, in the WLSiP package structure, the excess conductive material may be removed while remaining more conductive material on the first chip 33 and in contact with the conductive sidewall 351, which may improve the shielding effect of the shielding housing.

As disclosed, the technical solution of the present disclosure has the following advantages.

For example, the trench surrounding the each first chip is formed in the encapsulation layer. The conductive sidewall is formed by filling the conductive material in the trench and is surrounding the sides of the first chip. The conductive layer connected with the conductive sidewall is formed above the first chip. The conductive layer and the conductive sidewall form the shielding housing, which may protect the first chip in the shielding housing and reduce the interference of external magnetic fields on the first chip. Since the shielding housing is formed above a portion of the first chip, it may not increase the thickness and volume of entire packaging structure, which may make the packaging structure lighter.

The embodiments disclosed herein are exemplary only. Other applications, advantages, alternations, modifications, or equivalents to the disclosed embodiments are obvious to those skilled in the art and are intended to be encompassed within the scope of the present disclosure.

What is claimed is:

1. A wafer-level system-in-package packaging method, comprising:
   forming a bonding structure, wherein the bonding structure includes a device wafer and a plurality of chips bonded to the device wafer, wherein the plurality of chips contains one or more first chips to-be-shielded and the device wafer contains a plurality of second chips;
   forming an encapsulation layer covering the plurality of chips;
   forming a trench in the encapsulation layer to surround each first chip of the one or more first chips; and
   forming a conductive material in the trench and on the encapsulation layer, wherein:
      the conductive material includes a shielding housing, the shielding housing including a conductive sidewall formed in the trench and a conductive layer formed on a portion of the encapsulation layer above the each first chip and connected with the conductive sidewall, and
      the conductive material fills up the trench and a thickness of the conductive sidewall equals a width of the trench.

2. The method according to claim 1, wherein forming the conductive material in the trench and on the encapsulation layer further includes:
   covering the encapsulation layer with the conductive material; and
   forming the conductive layer by removing a first portion of the conductive material to leave a second portion of the conductive material remain on the portion of the encapsulation layer above the each first chip.

3. The method according to claim 1, wherein:
the trench is formed using an etching process.

4. The method according to claim 3, wherein:
the etching process is a laser etching process.

5. The method according to claim 1, wherein:
the conductive material is made of a metal, formed by an electroplating process.

6. The method according to claim 1, wherein:
the encapsulation layer is made of a material including a polymer or a dielectric.

7. The method according to claim 1, wherein:
the encapsulation layer is formed by an injection molding process.

8. The method according to claim 1, wherein:
the trench exposes the device wafer or a bottom of the trench is in the encapsulation layer.

9. The method according to claim 1, wherein:
the width of the trench is in a range of about 10 micrometers to about 50 micrometers.

10. The method according to claim 1, wherein:
a side of the trench adjacent to the each first chip is an inner sidewall; and
a distance between the inner sidewall and the each first chip is in a range of about 5 micrometers to about 100 micrometers.

11. A package structure of a wafer-level system-in-package, comprising:
   a device wafer;
   a plurality of chips bonded to the device wafer, wherein the plurality of chips contains one or more first chips to-be-shielded and the device wafer contains a plurality of second chips;
   an encapsulation layer covering the plurality of chips, wherein the encapsulation layer has a trench in the encapsulation layer to surround each first chip of the one or more first chips;
   a conductive sidewall in the encapsulation layer to surround each first chip of the one or more first chips, wherein the conductive sidewall fills up the trench and a thickness of the conductive sidewall equals a width of the trench; and
   a conductive layer which is formed on the encapsulation layer above the each first chip and is connected with the conductive sidewall to form a shielding housing.

12. The structure according to claim 11, wherein:
the conductive layer partially covers the encapsulation layer above the each first chip.

13. The structure according to claim 11, wherein:
the encapsulation layer is covered with the conductive layer; and
the conductive layer is above the first chip and is connected with the conductive sidewall.

14. The structure according to claim 11, wherein:
the shielding housing is made of a metal.

15. The packaging structure according to claim 11, wherein:
the encapsulation layer is made of a material including a polymer or a dielectric.

16. The structure according to claim 11, wherein:
the encapsulation layer is an injection layer.

17. The structure according to claim 11, wherein:
a bottom of the conductive sidewall is in contact with the device wafer or the bottom of the conductive sidewall is in the encapsulation layer.

18. The structure according to claim 11, wherein:
the thickness of the conductive sidewall is in a range of about 10 micrometers to about 50 micrometers.

19. The structure according to claim 11, wherein:
a side of the conductive sidewall adjacent to the first chip is an inner sidewall; and
a distance between the inner sidewall and the first chip is in a range of about 5 micrometers to about 100 micrometers.

20. A wafer-level system-in-package packaging method, comprising:
forming a bonding structure, wherein the bonding structure includes a device wafer and a plurality of chips bonded to the device wafer, wherein the plurality of chips contains one or more first chips to-be-shielded;
forming an encapsulation layer covering the plurality of chips;
forming a trench in the encapsulation layer to surround each first chip of the one or more first chips; and
forming a conductive material in the trench and on the encapsulation layer, wherein:
the conductive material includes a shielding housing, the shielding housing including a conductive sidewall formed in the trench and a conductive layer formed on a portion of the encapsulation layer above the each first chip and connected with the conductive sidewall;
forming the conductive material in the trench and on the encapsulation layer further includes:
covering the encapsulation layer with the conductive material; and
forming the conductive layer by removing a first portion of the conductive material to leave a second portion of the conductive material remain on the portion of the encapsulation layer above the each first chip;
a side of the conductive sidewall opposite to the each first chip is an outer side surface; and
forming the conductive layer includes:
forming a mask layer on the conductive material, wherein the mask layer covers the second portion of the conductive layer above the each first chip and a sidewall of the mask layer aligns with the outer side surface, and
removing the first portion of the conductive material exposed by the mask layer.

* * * * *